United States Patent [19]

Furutani et al.

[11] Patent Number: 4,922,460
[45] Date of Patent: May 1, 1990

[54] SEMICONDUCTOR MEMORY DEVICE WITH FOLDED BIT LINE STRUCTURE SUITABLE FOR HIGH DENSITY

[75] Inventors: Kiyohiro Furutani; Kazutami Arimoto, both of Hyogo, Japan

[73] Assignee: Mitsubishi Denki Kabushiki Kaisha, Tokyo, Japan

[21] Appl. No.: 364,516

[22] Filed: Jun. 9, 1989

Related U.S. Application Data

[63] Continuation of Ser. No. 146,687, Jan. 20, 1988, abandoned.

[30] Foreign Application Priority Data

Jan. 26, 1987 [JP] Japan .................................. 62-15705

[51] Int. Cl.⁵ .................. G11C 13/00; G11C 11/40
[52] U.S. Cl. ....................... 365/207; 365/51; 365/189.01
[58] Field of Search ............. 365/207, 51, 189.01, 365/202, 203, 214

[56] References Cited

U.S. PATENT DOCUMENTS

| | | | |
|---|---|---|---|
| 3,518,640 | 6/1970 | Cassidy | 365/214 |
| 3,646,531 | 2/1972 | Marahashi | 365/214 |
| 3,681,767 | 8/1972 | Moore | 365/214 |
| 3,942,164 | 3/1976 | Dunn | 365/214 |
| 4,675,845 | 6/1987 | Itoh et al. | 365/189 |
| 4,733,374 | 3/1988 | Furuyama et al. | 365/208 |
| 4,739,497 | 4/1988 | Itoh et al. | 365/189 |
| 4,739,500 | 4/1988 | Miyamoto et al. | 365/189 |

Primary Examiner—Terrell W. Fears
Attorney, Agent, or Firm—Lowe, Price, LeBlanc, Becker & Shur

[57] ABSTRACT

Provided is a memory cell array structure in a DRAM capable of easily reducing the area occupied by a memory cell array while retaining advantages of a folded bit line structure. The memory cell array comprises a plurality of memory cell array blocks each divided into two subblocks. Each of the subblocks has a structure in which the first bit lines each having a predetermined number of memory cells connected, second bit lines which are pass bit lines each comprising only an interconnection layer and third bit lines having a predetermined number of memory cells connected are repeatedly arranged in this order. In addition, the second bit lines in one sub-array block are connected to the third bit lines in the other sub-array block, and the third bit lines in one sub-array block are connected to the second bit lines in the other sub-array block. Furthermore, each of the sub-array blocks comprises sense amplifiers for differently amplifying signals on the first bit lines and the second bit lines in each of the sub-array blocks.

9 Claims, 8 Drawing Sheets

SEMICONDUCTOR MEMORY DEVICE WITH FOLDED BIT LINE STRUCTURE SUITABLE FOR HIGH DENSITY

This application is a continuation of application Ser. No. 146,687 filed Jan. 20, 1988, and now abandoned.

BACKGROUND OF THE INVENTION

1. Field of the Invention

The present invention relates to a semiconductor memory device and more particularly, to an improvement of a structure of a memory cell array in a dynamic random access memory with a folded bit line structure.

2. Description of the Prior Art

Figure 1:
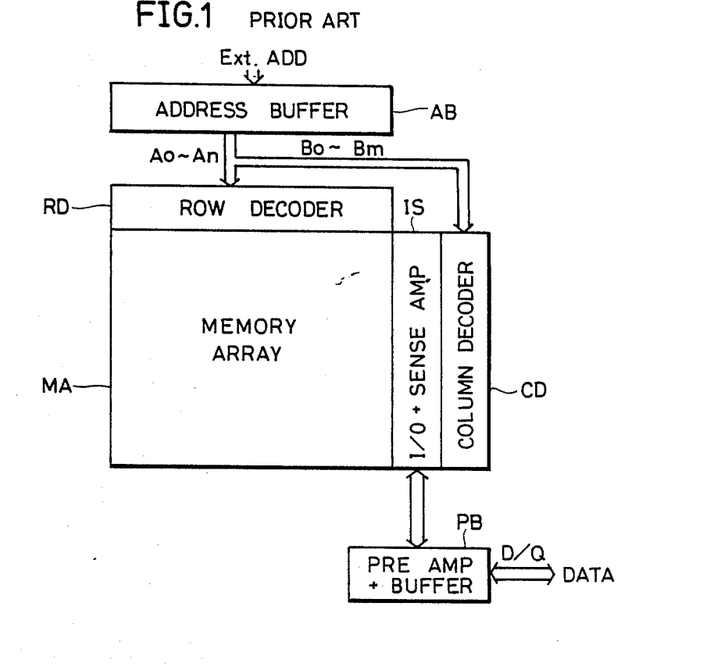
FIG. 1 is a diagram showing a typical example of a structure of a conventional DRAM.

It has been conventionally well-known that a semiconductor memory device comprises a dynamic random access memory as shown in FIG. 1. Referring to FIG. 1, the dynamic random access memory (DRAM) comprises a memory cell array MA having a plurality of memory cells arranged in a matrix of rows and columns, an address buffer AB receiving an external address signal Ext.ADD for generating internal row addresses A0 to An and internal column addresses B0 to Bm, a row decoder RD for decoding the internal row addresses A0 to An and selecting a single row from the memory cell array MA, a column decoder CD for decoding the internal column addresses and selecting a single or more columns from the memory cell array MA, an (I/O+sense amplifier) block IS for writing and reading information data from and to a memory cell designated by the external address Ext.ADD, and a (preamplifier+input/output buffer) block PB connected between the (I/O+sense amplifier) block IS and a data input/output terminal (not shown) for latching and amplifying data to be written or read.

Figure 2:
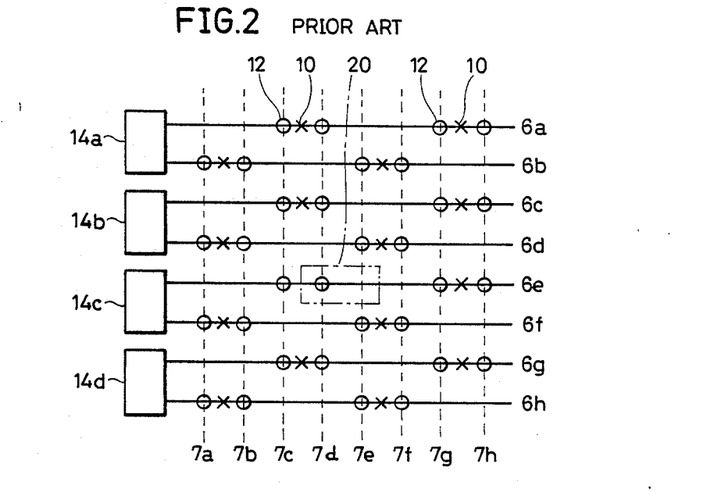
FIG. 2 is a diagram showing specifically a structure of a memory cell array with a conventional folded bit line structure.

In the memory cell array in the DRAM having such a structure, a folded bit line structure as shown in FIG. 2 has been conventionally used from the point of view of low noise and relaxing a pitch between sense amplifiers.

Referring to FIG. 2, bit lines 6a, 6b, 6c, 6d, 6e, 6f, 6g and 6h are arranged in parallel with each other. In addition, word lines 7a, 7b, 7c, 7d, 7e, 7f, 7g and 7h are arranged in the direction orthogonal to the bit lines 6a to 6h.

A sense amplifier 14a differentially amplifies signals on a bit line pair 6a and 6b. In the same manner, sense amplifiers 14b, 14c and 14d differentially amplify signals on a bit line pair 6c and 6d, signals on a bit line pair 6e and 6f and signals on a bit line pair 6g and 6h, respectively. Each of the bit lines 6a to 6h is connected to a data input/output bus (not shown in FIG. 2) through a column gate which is responsive to an output of a column decoder to be turned on.

As seen from FIG. 2, memory cells are arranged alternately in pairs on the pairs of bit lines and a memory cell is located only at either one of intersections of the paired bit lines (for example, 6a and 6b) and one word line (for example, 7a). For example, a memory cell (a channel portion 12 of a transfer gate, to be exact) is provided at each intersection of the bit line 6a and the word lines 7c, 7d, 7g and 7h. In addition, a memory cell (a channel portion 12 of a transfer gate in the memory cell, to be exact) is provided at each intersection of the bit line 6b and the word lines 7a, 7b, 7e and 7f.

Furthermore, memory cells (channels 12) are provided at intersection of a single word line (for example, 7a) and bit lines (for example, 6b, 6d, 6f and 6h) every other bit line. 2-bit memory cells connected to the same bit line (for example, 6a) and adjacent to each other are connected to a bit line (for example, 6a) through contact holes 10.

In the above described structure, when a single word line (for example, 7a) is selected, a memory cell connected to either one bit line (for example, 6b) of the paired bit lines is selected.

Figure 3:
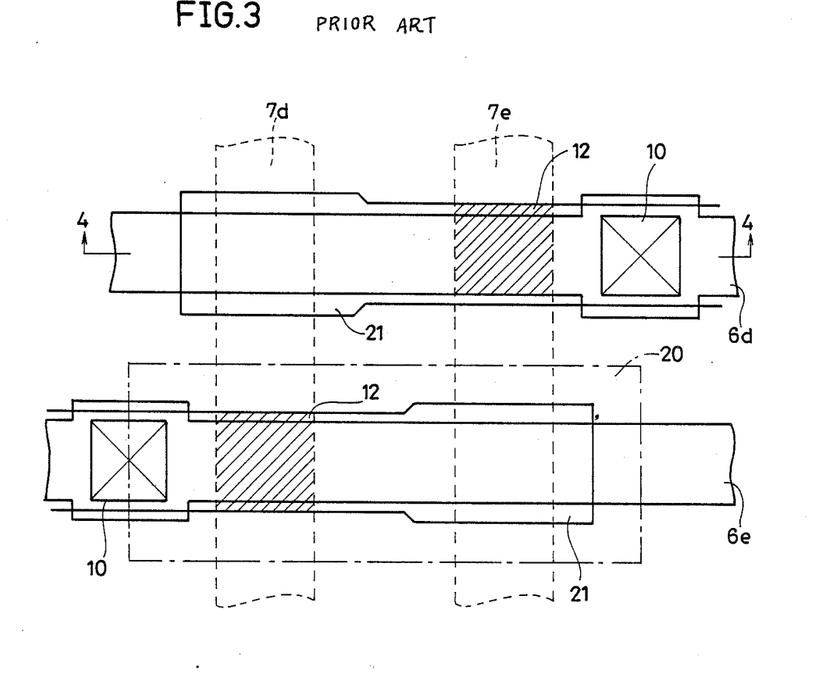
FIG. 3 is a plan view showing an example of a structure of a 1-bit memory cell region with the conventional folded bit line structure.
Figure 4:
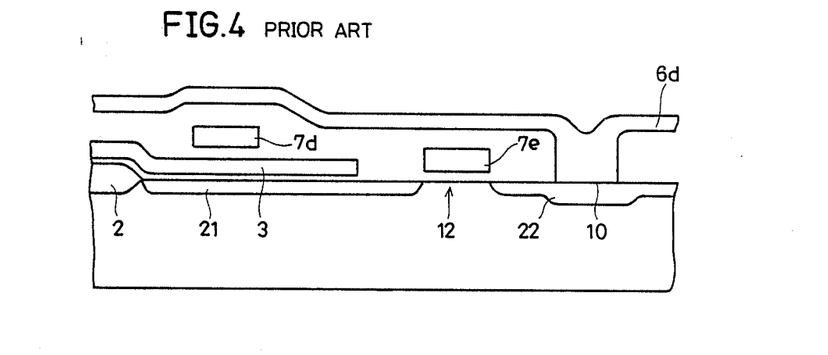
FIG. 4 is a cross sectional view taken along a line 4—4 shown in FIG. 3.

1-bit memory cell region 20 shown in FIG. 2 is specifically illustrated in FIGS. 3 and 4. FIG. 3 is a plan view of the 1-bit memory cell region, and FIG. 4 is a cross sectional view taken along a line 4—4 shown in FIG. 3, wherein a memory cell of a planar type capacitor is shown by way of example. A single memory cell comprises a single transfer gate and a single capacitor. Referring to FIGS. 3 and 4, a transfer gate comprises a word line 7e and diffusion layers 21 and 22. The diffusion layer (a source region of the transfer gate) 22 is connected to a bit line 6d through a contact hole 10. The capacitor portion comprises a cell plate 3 serving as one electrode of the capacitor, the diffusion layer 21 serving as a storage node in which information is stored and an insulating film between the diffusion layer 21 and the cell plate 3. A channel portion 12 of the transfer gate is located at an intersection of the word line 7e and the bit line 6d. A word line 7d crosses over the cell plate 3 of the memory cell connected to the bit line 6d.

As seen from FIGS. 2 to 4, in the conventional folded bit line structure, two word lines are provided in a 1-bit memory cell region.

When the memory cell capacitor 21 (or storage node) stores information charge, the memory cell capacitor 21 is charged to be a power-supply potential or a ground potential. Thus, by determining whether the memory cell capacitor 21 is charged to be a power-supply potential or a ground potential, it can be known whether the selected memory cell capacitor 21 stores information "0" or "1".

An operation for reading out information stored in the memory cell capacitor 21 is generally performed as follows.

All of the bit lines 6 (in the following description, when bit lines are generically referred to, the attached alphabets are omitted. It is the same with sense amplifiers and word lines) are precharged to be a precharge potential which is, in general, a half of the power-supply potential. A memory cycle is then started, so that the internal row addresses A0 to An are generated in response to the external address Ext.ADD. The internal row addresses A0 to An are decoded by the row decoder RD, so that a corresponding word line is selected, and a potential on the selected word line is increased. In order to simplify the explanation, it is assumed that the word line 7d shown in FIG. 2 is selected. When a potential on the word line 7d is increased, a channel region 12 formed under the word line 7d is rendered conductive, so that the memory cell capacitors connected to the channel portions which are rendered conductive are connected to the bit lines 6a, 6c, 6e and 6g, respectively. At that time, a potential on a bit line connected to the memory cell capacitor which is charged to be a power-supply potential, of the bit lines 6a, 6c, 6e and 6g is shifted to a potential higher than the precharge potential, and a potential on a bit line connected to a memory cell capacitor which is charged to be a ground potential is shifted to a potential lower than the precharge potential. On the other hand, potentials on the remaining bit lines 6b, 6d, 6f and 6h remain at the precharge potential. Thus, one bit line of a bit line pair connected to a single sense amplifier 14 is at the precharge potential, and the other bit line is at a potential which is higher or lower than the precharge potential. Then, when the sense amplifier 14 is activated, the potential difference between the bit line pair is differentially amplified. Finally, a single column (a pair of bit lines) is selected by the column decoder CD in response to the internal column addresses from the address buffer AB, so that a signal amplified by the sense amplifier 14 is transmitted to a data bus. Thus, it follows that information stored in a memory cell designated by the external address Ext-.ADD is read out. After the word line 7d is selected, the potentials on the bit lines 6a, 6c, 6e and 6g are compared with the precharge potentials on the bit lines 6b, 6d, 6f and 6h which are paired with the bit lines 6a, 6c, 6e and 6g, respectively, whereby information stored in the memory cell capacitor is detected. More specifically, it is determined whether the potentials on the bit lines 6a, 6c, 6e and 6g are higher or lower than the precharge potentials, whereby information stored in the memory cell capacitor is detected.

In such a semiconductor memory device with a folded bit line structure, since a pair of bit lines connected to a single sense amplifier extends adjacent to and in parallel with each other in the same direction, coupling noise received from a semiconductor substrate, a cell plate and/or a word line appears as a common mode noise in each bit line pair. As a result, the common mode noises which appear in the bit line pair are cancelled each other. Therefore, a sense amplifier connected to a bit line pair is not affected by noise, so that a malfunction due to noise does not occur easily.

Furthermore, as can be seen best from FIG. 2, since a pitch for arrangement between sense amplifiers is relaxed to a pitch of 2-bit memory cells, a design rule for a sense amplifier can be easily accommodated into a design rule for a memory cell array.

However, in the conventional semiconductor memory device with a folded bit line structure, bit lines are arranged adjacent to and in parallel with each other, so that one bit line 6 and two word lines 7 are arranged within a 1-bit memory cell region, as shown in FIGS. 2 to 4. Thus, if it is desired to decrease the plane area of a memory cell array for high integration, the area of the 1-bit memory cell should be decreased. In this case, it is necessary that the two word lines are strictly defined to be arranged in parallel with each other within the 1-bit memory cell region. Therefore, high resolution is required in, for example, a photolithography apparatus, so that the price of the apparatus is raised. In addition, a margin for offset of patterns of the word lines is decreased, so that it becomes difficult to manufacture the apparatus.

The prior art of proposing an improvement of a cell array with a folded bit line structure is described in (1) an article by T. Matsumura, entitled "MEMORY ARRAYS FOR HIGH DENSITY DRAM", 1985 IECE Japan, Semiconductor Material Section, National Conference, Proceeding, 1985, P. 2–131, and (2) an article by A.H. Shah et al., entitled "A 4Mb DRAM with Cross Point Trench Transistor Cell", IEEE ISSCC Digest of Technical Papers, 1986, pp. 268–269 and 369.

The first prior art discloses an array structure in which a memory cell array is divided into a plurality of sub-arrays in the direction of bit lines, pass bit lines (bit lines each comprising only an interconnection layer) formed of an interconnection of a different level from that of the bit lines are formed in each of the sub-arrays, and the pass bit lines and the bit lines in the adjacent sub-arrays are connected to each other not to have intersecting portions. In this structure, sense amplifiers are provided on both sides of the sub-arrays. However, it becomes difficult to provide symmetrically the sense amplifiers on both sides of the sub-arrays and to form the same using a symmetrical circuit structure, which presents a problem in, for example, a layout. Further, in this structure, a pass bit line and a bit line are formed of different levels of interconnections, so that an extra interconnection layer is needed and an additional process for the layer is required.

The second prior art discloses a DRAM using Double-Ended Adaptive Folded bit line scheme in which a memory cell array is divided into sub-arrays, a pass word line region and a pass bit line region are removed, memory cells are provided at intersections of the word lines and the bit lines, a bit line connected to the selected memory cell is connected to a different global bit line by a segment select, and 2-bit information is detected every one bit by sense amplifiers provided on both sides of the array. In this structure, a reference bit line is selected by a section select. However, in order to connect the bit line to the global bit line, two switches, that is, the section select and the segment select must be operated, so that a structure and an operation of the cell array are complicated.

SUMMARY OF THE INVENTION

An object of the present invention is to provide a novel memory cell array structure capable of easily reducing the plane area of a memory cell array, that is, reducing the area of a 1-bit memory cell while retaining advantages of a conventional folded bit line structure.

The memory cell array structure according to the present invention comprises a cell array block divided into first and second blocks, each of the first and second blocks comprising first bit lines each having a predetermined number of memory cells connected, pass bit lines each comprising only an interconnection layer and second bit lines each having a predetermined number of memory cells connected, and further comprising means for connecting the pass bit lines in the first block to second bit lines in the second block, means for connecting the pass bit lines in the second block to second bit lines in the first block, means provided on one side of the cell array block for differentially amplifying a signal on the first bit line in the first block and a signal on the pass bit line in the first block connected to the second bit line in the second block, and means provided on the other side of the cell array block for differentially amplifying a signal on the first bit line in the second block and a signal on the second bit line in the first block connected to the pass bit line in the second block.

In the above described structure, since no pass word line exists but only a single word line exists in a 1-bit memory cell region, the area occupied by the 1-bit memory cell can be easily reduced. In addition, even if memory cells are provided at all intersections of word lines and the first and second bit lines, a pitch for arrangement between sense amplifiers can be ensured to be a pitch of 2-bit memory cells. As a result, a design rule for sense amplifiers can be easily accommodated into a design rule for the memory cell array, so that the cell array can be easily designed.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
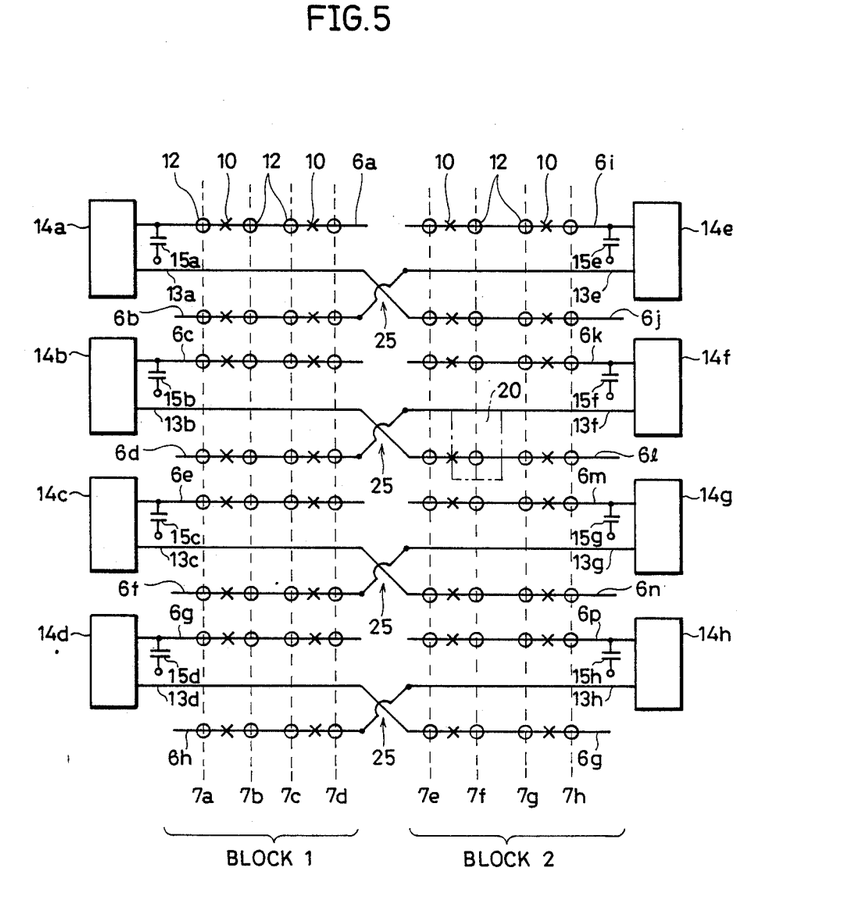
FIG. 5 is a diagram showing schematically a memory cell array structure according to an embodiment of the present invention.

FIG. 5 is a diagram showing schematically a memory cell array structure according to an embodiment of the present invention.

Referring to FIG. 5, a memory cell array is divided into two sub-array blocks BLOCK1 and BLOCK2. The first block BLOCK1 has a structure in which first bit lines (for example, 6a) each having a predetermined number of memory cells connected, second bit lines (for example, 13a) formed of pass bit lines each comprising only an interconnection layer and third bit lines (for example, 6b) each having a predetermined number of memory cells connected are arranged in parallel with each other repeatedly in this order.

In the same manner, the second block BLOCK2 has a structure in which fourth bit lines (for example, 6i) each having a predetermined number of memory cells connected, fifth bit lines (for example, 13e) formed of pass bit lines each comprising only an interconnection layer and sixth bit lines (for example, 6j) each having a predetermined number of memory cells connected are arranged in parallel with each other repeatedly in this order. The second bit lines (pass bit lines, for example, 13a) in the first block are connected to the sixth bit lines (for example, 6j) in the second block at intersections 25. The third bit lines (for example, 6b) in the first block are connected to the fifth bit lines (pass bit lines, for example, 13e) in the second block at the intersections 25.

The bit lines are connected to each other at the intersections 25 using interconnection layers of different levels. For example, one connecting interconnection comprises an interconnection layer of the same level as that of the bit lines 6, and the other connecting interconnection comprises an interconnection layer of the different level from that of the bit lines 6. Thus, the bit lines are connected to each other in a three-dimensional manner at intersections. When bit lines are generically referred to, a reference numeral 6 is used. When a particular bit line is indicated, a corresponding alphabet is attached to 6. It is the same with sense amplifiers and word lines.

The first block BLOCK1 and the second block BLOCK2 have structures which are symmetric with respect to a straight line connecting the intersections 25. Thus, the same number of memory cells are connected to the bit lines 6, respectively. In addition, the pass bit lines 13 have the same parasitic capacitance.

Word lines 7a to 7h are provided in the direction orthogonal to the bit lines 6 and the pass bit lines 13.

Memory cells (channel portions 12 of the transfer gates included in the memory cells, to be exact) are provided at intersections of the word lines 7 and the bit lines 6. The channel portions 12 are connected to the bit lines 6 through contact holes 10.

Sense amplifiers 14a to 14h each for differentially amplifying the difference between signals on a bit line 6 and the paired pass bit line 13 are provided in a left end of the first block BLOCK1 and a right end of the second block BLOCK2. For example, the sense amplifier 14a differentially amplifies the signal on the bit line 6a and the signal on the pass bit line 13a connected to the bit line 6j.

Capacitance values associated with a first bit line (for example, 6a), a pass bit line (for example, 13a) which is paired with the first bit line and a sixth bit line (for example, 6j) are different from each other. As a result, some problems occur. For example, when information stored in a memory cell is read out, a difference is made between the amount of change in signal potential which appears on the first bit line and the amount of change in signal potential which appears on the pass bit line, so that an operating margin of a sense amplifier is decreased. To avoid this, additional capacitances 15 each having the same capacitance value as that associated with the pass bit lines 13 are provided in the first bit lines (for example, 6a) in the first block BLOCK1 and the fourth bit lines (for example, 6i) in the second block BLOCK2. Capacitances of a pair of bit lines connected to a single sense amplifier 14 can be balanced by the additional capacitances 15, so that a problem caused by the imbalance of capacitance can be solved.

An operation of the sense amplifier 14a is simply described by way of example. When a word line 7 included in the first block BLOCK1 is selected, information stored in a memory cell capacitor appears on the first bit line 6a. On the other hand, the change in signal potential does not appear on the pass bit line 13a and the bit line 6j connected to the pass bit line 13a, so that the pass bit line 13a and the bit line 6j remain at a predetermined precharge potential. The sense amplifier 14a compares a signal potential on the bit line 6a with the precharge potential, and determines whether the selected memory cell capacitor stores information "0" or "1". The information detected by the sense amplifier 14a is read out by reading means, not shown, (for example, a column gate which is turned on in response to an output of a column decoder and a data bus connected to a bit line and a pass bit line, respectively, through the column gate). At the same time, memory cells connected to the bit line 6b are also selected, so that signal potentials on the bit line 6b and the pass bit line 13e are also changed. Thus, at the same time, the sense amplifier 14e detects 1-bit information. In this case, if sense amplifiers on both sides of the memory cell array are simultaneously activated and data detected by the sense amplifiers (for example, 14a and 4e) on both sides thereof are simultaneously read out by the output of the column decoder, 2-bit data can be obtained. When only 1-bit data is required, it is necessary to select either one of the 2-bit data in response to an address signal (Ext.ADD) after reading 2-bit data.

If and when word lines included in the second block BLOCK2 are selected, the same operation as described above is performed.

Meanwhile, the first bit line (for example, 6a) constitutes one bit line, and other bit line which is paired with the first bit line comprises the pass bit line and the sixth bit line (for example, 6j), so that a difference in stray capacitance is made therebetween. However, since the first bit line (for example, 6a) is provided with an additional capacitance 15a having the same capacitance as that of the pass bit line (for example, 13a), so that the difference in stray capacitance therebetween is compensated for, so that a problem caused by the difference in stray capacitance can be solved. It is the same with the fourth bit line (for example, 6i).

Figure 6:
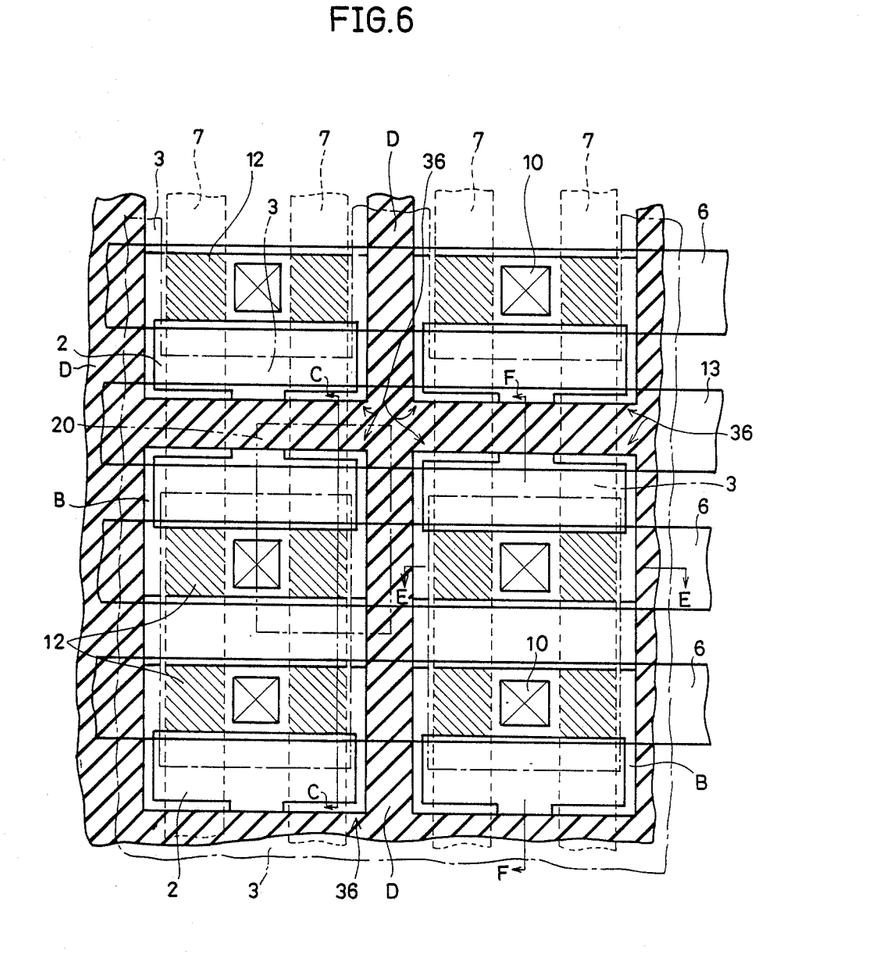
FIG. 6 is a diagram showing a plane layout of a memory cell array according to an embodiment of the present invention.

FIG. 6 is a plan view showing a layout of a memory cell array according to an embodiment of the present invention. Referring to FIG. 6, 4-bit memory cells are formed in a region B as a unit. Channel portions 12 of transfer gates included in the memory cells are formed at intersections of word lines 7 and bit lines 6. The region B for defining the 4-bit memory cell region is electrically isolated from an adjacent region B by a trench region D represented by coarse hatching. A memory cell capacitor portion 36 is formed on the sidewall of the trench region B. Thus, according to the present embodiment, a memory cell structure having a trench capacitor of an isolation merged type is used.

Figure 7:
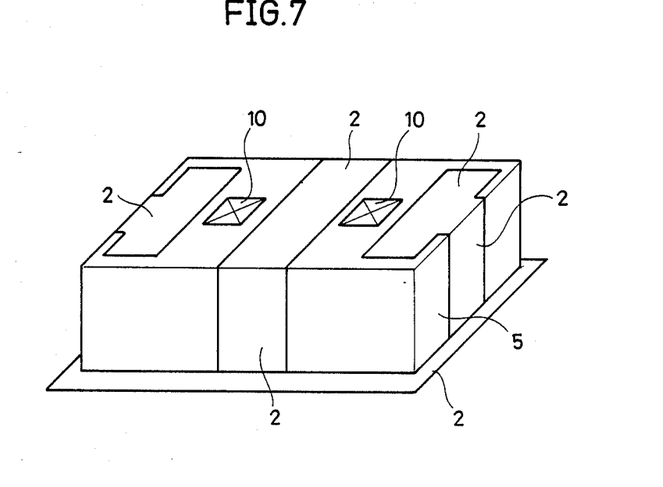
FIG. 7 is a perspective view showing a structure obtained by extracting a region B shown in FIG. 6.

FIG. 7 is a perspective view showing a structure obtained by extracting the region B shown in FIG. 6. Referring to FIG. 7, four memory cells are shown and one set of two cells are connected to a bit line and other set of two cells are connected to other bit line. The one set of two cells are isolated from other set of two cells by a centered isolation oxide film 2. Each of the memory cells is connected to a bit line through a contact hole 10. In each of the memory cells, an impurity diffusion layer 5 serving as a cell storage node is formed on the sidewall of the trench. The memory cell capacitor is isolated from an adjacent memory cell capacitor by the isolation oxide film 2. An isolation oxide film 2 for isolating adjacent memory cell capacitors is also formed in the bottom portion of the trench. The memory cell structure can be achieved using a conventional method for manufacturing a memory cell having a trench capacitor of an isolation merged type.

Figure 8:
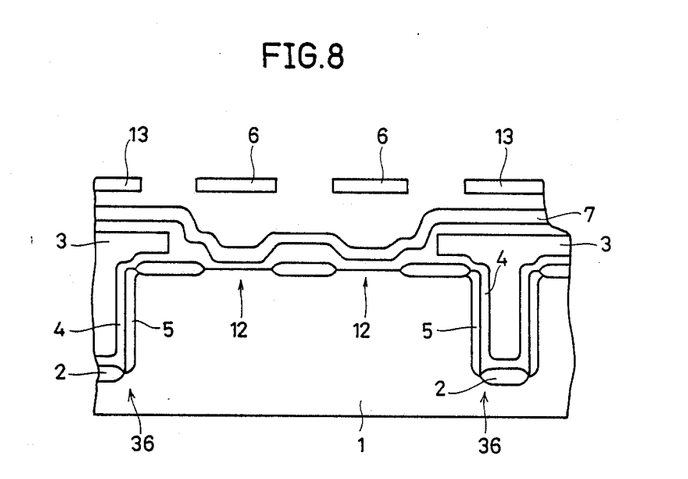
FIG. 8 is a cross sectional view taken along a line C—C shown in FIG. 6.

FIG. 8 is a cross sectional view taken along a line C—C shown in FIG. 6. Referring to FIG. 8, channel portions 12 are formed at intersecting portions of word lines 7 and bit lines 6 on the surface of a semiconductor substrate 1. Adjacent memory cell capacitors are isolated by isolation oxide films (2). Each of the memory cell capacitors 36 comprises an impurity diffusion layer 5 formed on the sidewall of a trench, an insulating film 4 formed on the inner surface of the trench and a low resistive layer 3 filling the trench and comprising, for example, polycrytstalline silicon (polysilicon). The impurity diffusion layer 5 serves as a cell storage node and the low resistive layer 3 serves as a cell plate.

Pass bit lines 13 are provided in parallel with the bit lines 6 to be located on trench regions D using interconnection layer of the same level as that of the bit lines 6. The bit lines 6 and the pass bit lines 13 may be formed of interconnection layers of different levels.

Figure 9:
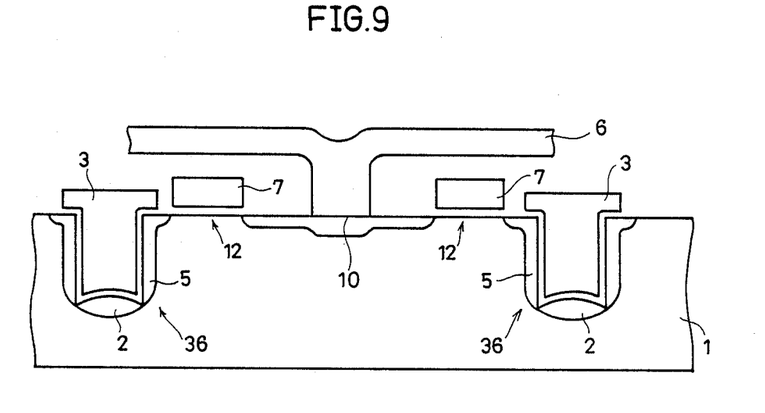
FIG. 9 is a cross sectional view taken along a line E—E shown in FIG. 6.
Figure 10:
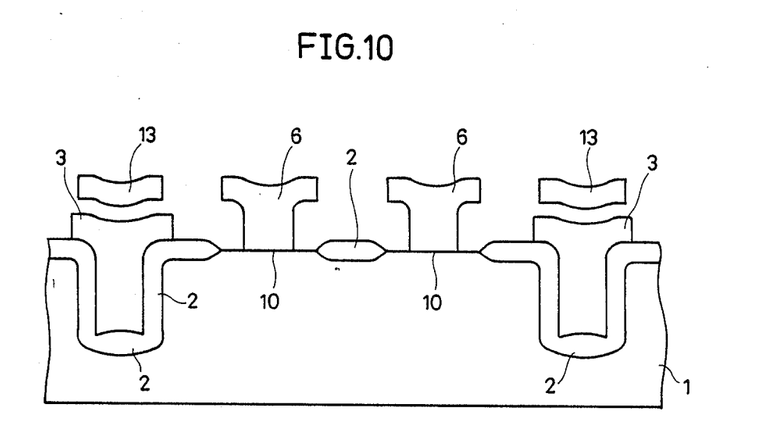
FIG. 10 is a cross sectional view taken along a line F—F shown in FIG. 6.

FIG. 9 is a cross sectional view taken along a line E—E shown in FIG. 6, and FIG. 10 is a cross sectional view taken along a line F—F shown in FIG. 6. More specifically, FIG. 9 illustrates a cross sectional structure of the region B, taken along the bit lines 6, and FIG. 10 illustrates a cross sectional structure of the region B, in the direction of the word lines.

Referring to FIG. 9, a single bit line 6 is connected to 2-bit memory cells through a contact hole 10. Channel portions 12 are formed on the surface of a semiconductor substrate 1, under the word lines 7 in the memory cell. Memory cell capacitors 36 are formed on the sidewalls of trenches on both sides. The memory cell capacitor formed on both sides of a single trench is isolated by an isolation oxide film 2 in the bottom portion of the trench.

Referring to FIG. 10, two bit lines 6 are shown. In addition, pass bit lines 13 provided on trench regions are shown. In this direction, no memory cell capacitor is formed but the isolation oxide films 2 are formed on the sidewalls of trenches.

In the above described layout of memory cells, a memory cell can be efficiently provided at an intersection of each word line and each bit line (excluding pass bit lines).

A region of a 1-bit memory cell is represented by a reference numeral 20 shown in FIG. 5. As can be seen best in the region 20 shown in FIG. 5, a single word line 7, a single bit line 6 and a half pass bit line 13 are arranged in the 1-bit memory cell region. Thus, even if the cell area is reduced, the word line need not be arranged more strictly, as compared with the case in which two word lines are arranged, so that the bit lines 6, the pass bit lines 13 and the word lines 7 can be easily arranged and the area occupied by a memory cell array can be easily reduced.

Figure 11:
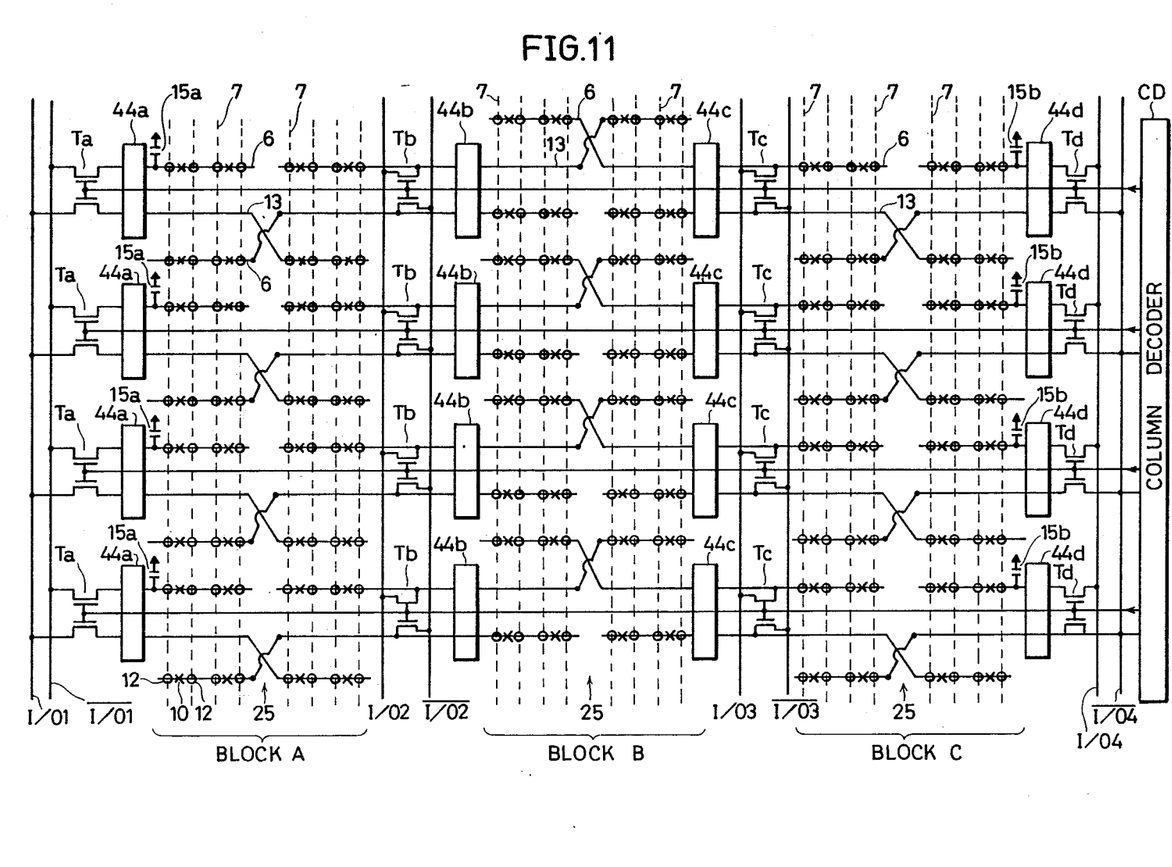
FIG. 11 is a diagram showing schematically a memory cell array structure according to another embodiment of the present invention.

FIG. 11 is a diagram showing a memory cell array structure according to another embodiment of the present invention.

Referring to FIG. 11, a memory cell array is divided into three blocks BLOCK A, BLOCK B and BLOCK C. Each of the blocks is divided into two subblocks. An array structure in each of the blocks is the same as that shown in FIG. 5.

Sense amplifiers 44b provided between the blocks BLOCK A and BLOCK B are used for both the blocks. Sense amplifiers 44c provided between the blocks BLOCK B and BLOCK C are used for both the blocks.

Data detected by the sense amplifiers 44a are transmitted to data input/output bases I/O1 and $\overline{I/O1}$ through column gates Ta whose operation is controlled by an output of a column decoder CD.

Data detected by the sense amplifiers 44b are transmitted to data input/output buses I/O2 and $\overline{I/O2}$ through column gates Tb.

Data detected by the sense amplifiers 44c are transmitted to data input/output buses I/O3 and $\overline{I/O3}$ through column gates Tc.

Data detected by the sense amplifiers 44d are transmitted to data input/output buses I/O4 and $\overline{I/O4}$ through column gates Td.

In the same manner, data are written through the data input/output buses I/O1 and $\overline{I/O1}$ to I/O4 and $\overline{I/O4}$ and the column gates Ta to Td. In FIG. 11, the column gates arranged on the same column (in the horizontal direction) receive the same column selecting signal from the column decoder CD.

Since both the sense amplifiers 44b and 44c differentially amplify a signal on a pair of bit lines (referred to as full bit lines, for convenience) comprising two bit lines 6 and a single pass bit line, stray capacitances in the full bit line pair become equal. Thus, capacitances 15 for the balance of capacitance need not be particularly provided in bit lines connected to the sense amplifiers 44b and 44c. Capacitances 15a and 15d for the balance of capacitance are provided in bit lines directly connected to the sense amplifiers 44a and 44b.

Description is now simply made on data reading operation in the array structure shown in FIG. 11.

Data reading operation to occur when the word lines 7 included in the block BLOCK A are selected is described by way of example.

At that time, the signal potential difference corresponding to information stored in the selected memory cell is made in each of the bit line pairs connected to the sense amplifiers 44a and 44b, respectively. The signal potential difference which appeared in each of the bit line pairs is differentially amplified by the sense amplifiers 44a and 44b. At that time, the sense amplifiers 44c and 44d are not activated. Selective activation of the sense amplifiers can be easily achieved by selectively activating only the sense amplifiers 44a and 44b connected to the BLOCK A in response to address signals.

Data of the bit line pair in a corresponding column, of information amplified by the sense amplifiers 44a and 44b are transmitted to a data input/output buses I/O1 and $\overline{I/O1}$ and I/O2 and $\overline{I/O2}$ by the output of the column decoder CD. Therefore, reading of 2-bit data is completed.

In the same manner, when the word lines 7 included in the block BLOCK B are selected, the sense amplifiers 44b and 44c are activated, so that detected data are transmitted to the data input/output buses I/O2 and $\overline{I/O2}$ and I/O3 and $\overline{I/O3}$ through the column gates Tb and Tc, respectively.

When the word lines 7 included in the block BLOCK C are selected, the sense amplifiers 44c and 44d are activated, so that detected data are transmitted to the data input/output buses I/O3 and $\overline{I/O3}$ and I/O4 and $\overline{I/O4}$ through the column gates Tc and Td, respectively.

Although reading operation of 2-bit data was described, 1-bit data can be easily read out. In this case, it is necessary to connect only one pair of data input/output buses, of two pairs of data input/output buses (for example, I/O1 and $\overline{I/O1}$ and I/O2 and $\overline{I/O2}$) to a data input/output buffer in response to an address signal by a multiplexer.

Figure 12:
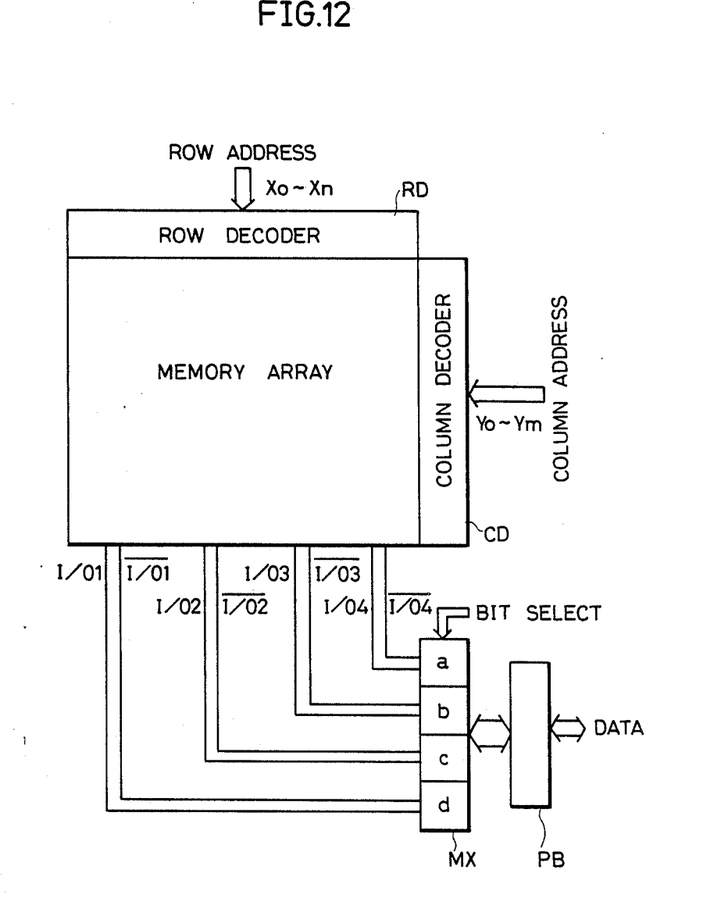
FIG. 12 is a diagram showing schematically an entire structure of a DRAM using the memory cell array structure shown in FIG. 11.

FIG. 12 is a diagram showing schematically an entire structure of a DRAM using the memory cell array structure shown in FIG. 11.

Referring to FIG. 12, the DRAM according to the present invention comprises a row decoder RD for decoding internal row addresses X0 to Xn and selecting a corresponding one word line, a column decoder CD for decoding internal column addresses Y0 to Ym and selecting a corresponding bit line pair, a memory cell array MA having memory cells arranged in a matrix of rows and columns (see FIG. 11), pairs of data input/output buses I/O1 and $\overline{I/O1}$, I/O2 and $\overline{I/O2}$, I/O3 and $\overline{I/O3}$ and I/O4 and $\overline{I/O4}$ for inputting and outputting data to and from a selected memory cell in the memory cell array, and a multiplexer MX responsive to a signal BIT SELECT which is formed in response to address signals for connecting a corresponding pair of data input/output buses, of the pairs of data input/output buses I/O1 and $\overline{I/O1}$ to I/O4 and $\overline{I/O4}$ to a data input/output buffer PB. The data input/output buffer has a preamplifier function for amplifying provided data to a predetermined level.

In the case of 2-bit data, the bit selecting signal BIT SELECT comprises the same signal as a block selecting signal for selectively activating sense amplifiers. On the other hand, in the case of 1-bit data, the bit selecting signal BIT SELECT further comprises a bus selecting signal. The bus selecting signal can be formed in response to the address signal.

Description is made on a data input/output operation. In a folded bit line structure, complementary signals appear in the pair of data input/output buses I/O and $\overline{I}/$ connected to the selected bit line pair. Thus, when data in the pair of data input/output buses I/O and $\overline{I}/$ is (1,0), the data corresponds to, for example, "1", and when data therein is (0,1), the data corresponds to, for example, "0". As a result, data writing/reading operation can be performed without using a complicated structure.

As described in the foregoing, since in the memory cell array structure according to the present invention, a single memory cell array block is divided into first and second sub-array blocks, each of the sub-array blocks having first bit lines, second bit lines comprising pass bit lines and third bit lines repeatedly arranged in this order, the pass bit lines (the second bit lines) in the first sub-array block is connected to the third bit lines in the second sub-array block, the third bit lines in the first sub-array block is connected to the pass bit lines (the second bit lines) in the second sub-array block, and sense amplifiers for differentially amplifying the difference in signal on the bit line pairs (the first bit lines and the second bit lines) are provided in opposite sides of the sub-array blocks, the area of the memory cell array can be easily reduced without eliminating advantages of the folded bit line structure. In addition, since a pitch for arrangement between sense amplifiers is relaxed to a pitch of 2-bit memory cells, a design rule for the sense amplifiers can be incorporated into a design rule of the memory cell array, so that a memory device can be easily designed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An improved integrated circuit memory cell array structure of a dynamic random access memory for high density, the improvement comprising:

a first subarray block;

first bit lines included in said first block, each said first bit line having a plurality of memory cells connected thereto,
second bit lines included in said first block, each said second said bit line comprising a conductive layer having no memory cells connected thereto,
third bit lines included in said first block, each said third bit line having a plurality of memory cells connected thereto,
said first block having a structure in which said first bit lines, said second bit lines and said third bit lines are repeatedly and periodically arranged in this order and are parallel with each other,
a second subarray block,
fourth bit lines included in said second block, each said fourth bit line having a plurality of memory cells connected thereto,
fifth bit lines include in said second block, each said fifth bit line comprising a conductive layer having no memory cells connected thereto,
sixth bit lines included in said second block, each said sixth bit line having a plurality of memory cells connected thereto,
said second block further comprising a structure in which said fourth bit lines, said fifth bit lines and said sixth bit lines are repeatedly and periodically arranged in this order and are parallel with each other,
first connecting means provided between said first block and said second block for connecting said second bit lines to said sixth bit lines,
second connecting means provided between said first block and said second block for connecting said third bit lines to said fifth bit lines,
first detecting means provided in said first block for differentially amplifying the difference in signal levels on said first bit lines, said second bit lines and said sixth bit lines,
second detecting means provided in said second block for differentially amplifying the difference in signal levels on said fourth bit lines, said third bit lines and said fifth bit lines wherein
said first detecting means is provided in an end opposite to said first and second connecting means in the first block, and
wherein said second detecting means is provided in an end opposite to said first and second connecting means in the second block.

2. The improvement according to claim 1, wherein said first bit lines comprise capacitor means having the same capacitance as that associated with said fifth bit lines.

3. The improvement according to claim 1, wherein said fourth bit lines comprise capacitor means having the same capacitance as that associated with said second bit lines.

4. The improvement according to claim 1, wherein said first detecting means and said second detecting means are connected to different data input/output lines.

5. The improvement according to claim 1, wherein said first detecting means and said second detecting means are provided to be arranged on the same column.

6. The improvement according to claim 1, wherein said first block and said second block constitute a single array block and said cell array comprises a plurality of said array blocks, and said detecting means is used for the adjacent array blocks.

7. The improvement according to claim 1, wherein said cell array comprises a plurality of word lines for selecting rows in said cell array, and memory cells are provided at all intersections of said word lines and said first, third, fourth and sixth bit lines.

8. An improved cell array structure of a dynamic random access memory for high density, comprising:
a first subarray block having first word lines;
first bit lines included in said first block and intersecting said first word lines, each said first bit line having a plurality of memory cells connected thereto;
second bit lines included in said first block and intersecting said first word lines, each said second bit lines having no memory cells connected thereto;
third bit lines included in said first block and intersecting said first word lines, each said third bit line having a plurality of memory cells connected thereto;
said first block having a structure in which said first bit lines, said second bit lines and said third bit lines are repeatedly and periodically arranged in this order and are parallel with each other;
a second subarray block having second word lines;
fourth bit lines included in said second block and intersecting said second word lines, each said fourth bit lines having a plurality of memory cells connected thereto;
fifth bit lines included in said second block and intersecting said second word lines, each said fifth bit lines having a plurality of memory cells connected thereto;
fifth bit lines included in said second block and intersecting said second word lines, each said fifth bit lines having no memory cells connected thereto;
sixth bit lines included in said second block and intersecting said second word lines, each said sixth bit lines having a plurality of memory cells connected thereto;
said second block comprising a structure in which said fourth bit lines, said fifth bit lines and said sixth bit lines are repeatedly and periodically arranged in this order and are parallel with each other;
first connecting means between said first block and said second block for connecting said second bit lines to said sixth bit lines;
second connecting means between said first block and said second block for connecting said second bit lines to said sixth bit lines;
second connecting means between said first block and said second block for connecting said third bit lines to said fifth bit lines;
first sense amplifier means in said first block for differentially amplifying differences in signal magnitudes on said first bit lines, said second bit lines and said sixth bit lines; and
second sense amplifier means in said second block for differentially amplifying differences in signal magnitudes on said fourth bit lines, said third bit lines and said fifth bit lines.

9. An improved cell array structure of a dynamic random access memory for high density, comprising:
a first subarray block;
first bit lines included in said first block, each said first bit line having a plurality of memory cells connected thereto;

second bit lines included in said first block lines, each said second bit lines having no memory cells connected thereto;

third bit lines included in said first block, each said third bit lines having a plurality of memory cells connected thereto;

a second subarray block;

fourth bit lines included in said second block, each said fourth bit lines having a plurality of memory cells connected thereto;

a second subarray block;

fourth bit lines included in said second block, each said fourth bit lines having a plurality of memory cells connected thereto;

fifth bit lines included in said second block, each said fifth bit lines having no memory cells connected thereto;

sixth bit lines included in said second block, each said sixth bit lines having a plurality of memory cells connected thereto;

connecting means located at one end of said first block and at one end of said second block for connecting (1) said second bit lines to said sixth bit lines and (2) said third bit lines to said fifth bit lines;

first sense amplifier means located at another end of said first block for differentially amplifying differences in signal magnitudes on said first bit lines, said second bit lines and said sixth bit lines; and second sense amplifier means located at another end of said second block for differentially amplifying differences in signal magnitudes on said fourth bit lines, said third bit lines and said fifth bit lines.

* * * * *